(12) United States Patent
Tung (10) Patent No.: US 9,799,553 B2
(45) Date of Patent: Oct. 24, 2017

(54) METHOD FOR MANUFACTURING SEMICONDUCTOR DEVICE WITH NANO-GAPS

(71) Applicant: UNITED MICROELECTRONICS CORP., Hsinchu (TW)

(72) Inventor: Yu-Cheng Tung, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/469,932

(22) Filed: Mar. 27, 2017

(65) Prior Publication Data

US 2017/0200633 A1 Jul. 13, 2017

Related U.S. Application Data

(62) Division of application No. 14/667,823, filed on Mar. 25, 2015, now Pat. No. 9,646,849.

(30) Foreign Application Priority Data

Mar. 11, 2015 (CN) .......................... 2015 1 0106223

(51) Int. Cl.
*H01L 21/768* (2006.01)

(52) U.S. Cl.
CPC ...... *H01L 21/7682* (2013.01); *H01L 21/7685* (2013.01); *H01L 21/76802* (2013.01)

(58) Field of Classification Search
CPC ........... H01L 21/76802; H01L 21/7682; H01L 21/7685
See application file for complete search history.

(56) References Cited

U.S. PATENT DOCUMENTS

| 5,847,464 A * | 12/1998 | Singh ...................... H01L 21/31 257/752 |
| 6,297,554 B1 * | 10/2001 | Lin ................... H01L 21/76808 257/752 |
| 6,764,919 B2 | 7/2004 | Yu et al. |
| 7,301,107 B2 | 11/2007 | Karthikeyan et al. |

(Continued)

OTHER PUBLICATIONS

P. Pimenta Barros et al., "Etch challenges for DSA implementation in CMOS via patterning", Proc. SPIE 9054, Advanced Etch Technology for Nanopatterning III, 90540G (Mar. 28, 2014); doi: 10.1117/12.2046267.

*Primary Examiner* — Peniel M Gumedzoe
(74) *Attorney, Agent, or Firm* — WPAT, PC (57) ABSTRACT

A semiconductor device and a method for manufacturing the same are provided. A semiconductor device includes a substrate, a first capping layer formed above the substrate, a first dielectric layer formed on the first capping layer; a second capping layer formed on the first dielectric layer; a second dielectric layer formed on the second capping layer; a plurality of conducting lines separately formed on the substrate; a third capping layer formed on the conducting lines and the second dielectric layer; and several nano-gaps formed between the adjacent conducting lines, and the nano-gaps being formed in the second dielectric layer, or further extending to the second capping layer or to the first capping layer. The nano-gaps partially open one of the second and first dielectric layers, or the nano-gaps expose the first capping layer or the second capping layer.

19 Claims, 13 Drawing Sheets

(56) References Cited

U.S. PATENT DOCUMENTS

| | | |
|---|---|---|
| 8,629,560 B2* | 1/2014 | Liu .................. H01L 21/76807 |
| | | 257/758 |
| 2005/0208752 A1 | 9/2005 | Colburn et al. |
| 2009/0035668 A1 | 2/2009 | Breyta et al. |
| 2011/0198757 A1 | 8/2011 | Su et al. |
| 2013/0075913 A1 | 3/2013 | Cooney, III et al. |
| 2014/0001597 A1 | 1/2014 | Huang et al. |
| 2014/0264896 A1 | 9/2014 | Lu et al. |

* cited by examiner

METHOD FOR MANUFACTURING SEMICONDUCTOR DEVICE WITH NANO-GAPS

This application is a Divisional of pending U.S. patent application Ser. No. 14/667,823, filed on Mar. 25, 2015, and entitled "SEMICONDUCTOR DEVICE WITH NANO-GAPS AND METHOD FOR MANUFACTURING THE SAME", which claims the benefit of People's Republic of China application Serial No. 201510106223.0, filed Mar. 11, 2015, the contents of which are incorporated herein by reference.

BACKGROUND

Technical Field

The disclosure relates in general to a semiconductor device and a method for manufacturing the same, and more particularly to a semiconductor device with nano-gaps and a method for manufacturing the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages or poor properties, which have considerable effects on the electrical properties, would be one of the important issues of the device for the manufacturers.

For one concerning aspect, a semiconductor device with good electrical performance requires the dielectric components with good properties. Therefore, it is one of desirable goals to develop a structure with good dielectric properties for improving the performances, and the structure can be fabricated by a simple process as well.

SUMMARY

The disclosure is directed to a semiconductor device with the nano-gaps and a method for manufacturing the same, and the nano-gaps improve the electrical properties of the semiconductor device.

According to the disclosure, a semiconductor device is provided, comprising a substrate, a first capping layer formed above the substrate, a first dielectric layer formed on the first capping layer; a second capping layer formed on the first dielectric layer; a second dielectric layer formed on the second capping layer; a plurality of conducting lines separately formed on the substrate and penetrating the second dielectric layer, the second capping layer, the first dielectric layer and the first capping layer; a third capping layer formed on the conducting lines and the second dielectric layer; and a plurality of nano-gaps formed between the adjacent conducting lines, and the nano-gaps being formed in the second dielectric layer, or further extending to the second capping layer or to the first capping layer. The nano-gaps partially open one of the second and first dielectric layers, or the nano-gaps expose the first or second capping layer.

According to the disclosure, a method for manufacturing a semiconductor device is provided. A substrate is provided, and a first capping layer is formed above the substrate. A first dielectric layer is formed on the first capping layer, a second capping layer is formed on the first dielectric layer, and a second dielectric layer is formed on the second capping layer. The conducting lines are formed on the substrate, wherein the conducting lines separate from each other and penetrate the second dielectric layer, the second capping layer, the first dielectric layer and the first capping layer. A plurality of nano-gaps are formed between the conducting lines and positioned in the second capping layer or extend to the first capping layer, wherein the nano-gaps partially open (/expose) one of the second and first dielectric layers, or expose the first capping layer. Also, a third capping layer is formed on the conducting lines, the second dielectric layer and the nano-gaps.

BRIEF DESCRIPTION OF THE DRAWINGS

FIG. 1A-FIG. 1F-4 illustrate a method for manufacturing a semiconductor device according to the first embodiment of the present disclosure.

DETAILED DESCRIPTION

In the present disclosure, a semiconductor device and a method for manufacturing the same are provided, to form numerous nano-gaps between the conductive lines of the semiconductor device. The electronic device with a semiconductor device having the nano-gaps for insulating the conductive lines as illustrated by any one of the embodiments possesses good electrical properties, such as the increase of the programming speed and the less power consumption during operation. Also, the methods provided in the embodiments also simplify the manufacturing process.

Several embodiments are provided hereinafter with reference to the accompanying drawings for describing the related configurations and procedures. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

First Embodiment

Figure 1A:
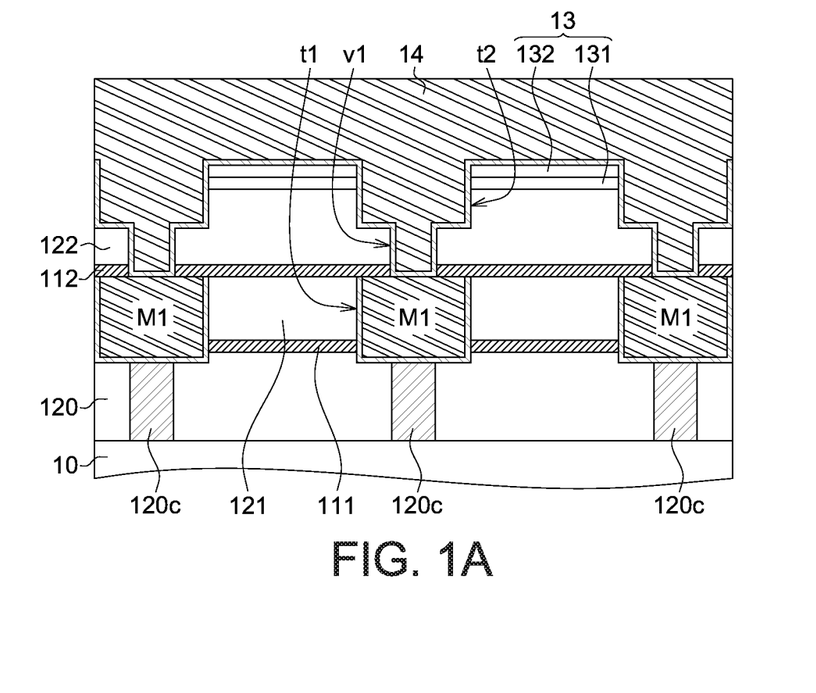

FIG. 1A-FIG. 1F-4 illustrate a method for manufacturing a semiconductor device according to a first embodiment of the present disclosure. A copper (Cu) layer formed by a damascene process is taken for illustration. First, a substrate 10 with plural dielectric layers and capping layers alternately formed thereon is provided. A laminated structure provided in FIG. 1A comprises a first capping layer 111 formed above the substrate 10, a first dielectric layer 121 such as a low dielectric constant (k)(low-k) dielectric layer formed on the first capping layer 111, a second capping layer 112 formed on the first dielectric layer 121, a second dielectric layer 122 such as an ultra low-k (ULK) dielectric layer formed on the second capping layer 112. In one embodiment, the laminated structure as shown in FIG. 1A further comprises an interlayer dielectric (ILD) layer 120 formed on the substrate 10 and a diffusion barrier 13 formed on the second dielectric layer 122, wherein the first capping layer 111 is formed on the ILD layer 120, and plural conductive contacts 120c are formed in the ILD layer 120. Also, a metallic material 14 is formed (such as by electroplating, ECP) above the second dielectric layer 122 (such as formed on the diffusion barrier 13) for filling the trenches (t1 and t2) and via (v1) in the laminated structure of FIG. 1A. In one embodiment, a copper (Cu) layer is implemented as the metallic material 14 for forming a first metal layer (M1) in the trench t1 and/or a second metal layer (M2) in the trench t2 communicating the first metal layer (M1) by copper in the via v1. In one embodiment, the first metal layer (M1) and the second metal layer (M2) are formed by different steps.

In one embodiment, a SiON layer 131 and a TiN layer 132 can be served as the diffusion barrier 13 against Cu penetration. The disclosure is not limited to those materials for being the diffusion barrier 13, and other suitable materials may be adopted depending on the practical applications. Additionally, according to the typical technology for classifying the dielectric properties of the materials, a dielectric film with a dielectric constant (k) in a range of 4.5 to 10 ($4.5<k<10$) is classified as a dielectric film with standard k, and a dielectric film with a dielectric constant (k) smaller than 3 ($k<3$) is referred to a low-k dielectric film, and a dielectric film with a dielectric constant (k) smaller than 2 ($k<2$) is referred to a ultra low-k (ULK) dielectric film.

Figure 1B:
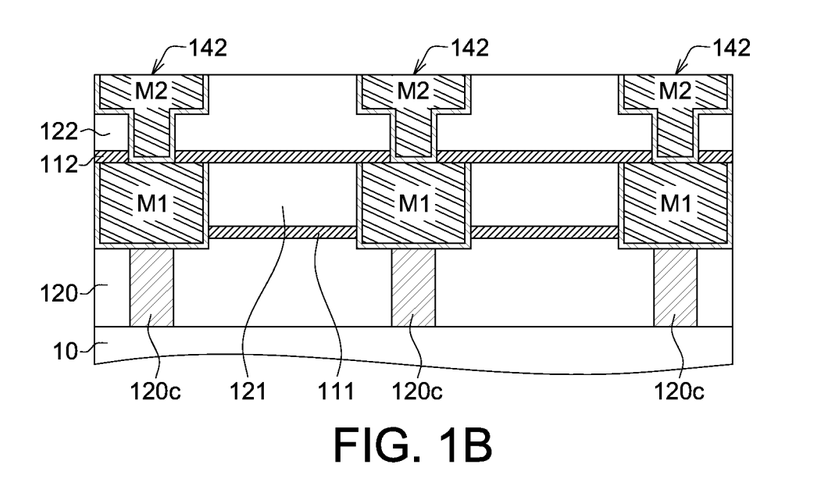

Then, the metallic material 14 is planarized to expose the top surface of the second (low-k) dielectric layer 122 by removing the diffusion barrier 13, as shown in FIG. 1B. The planarization step can be performed by chemical mechanical polishing/planarization (CMP). After planarization, a plurality of conducting lines 142 are separately formed on the substrate 10, and each of the conducting lines 142 penetrate the second dielectric layer 122, the second capping layer 112, the first dielectric layer 121 and the first capping layer 111. The conducting lines (such as Cu lines) 142 are electrically connected to the conductive contacts 120c, respectively.

Afterwards, the procedures for patterning at least one of the dielectric layers are conducted to form a plurality of nano-gaps between the adjacent conducting lines 142. According to the embodiments, a directed self assembly (DSA) material (i.e. a material with DSA property), is adopted, followed by self separation of the DSA material, so as to form an etch mask for patterning one or both of the dielectric layers.

Figure 1C:
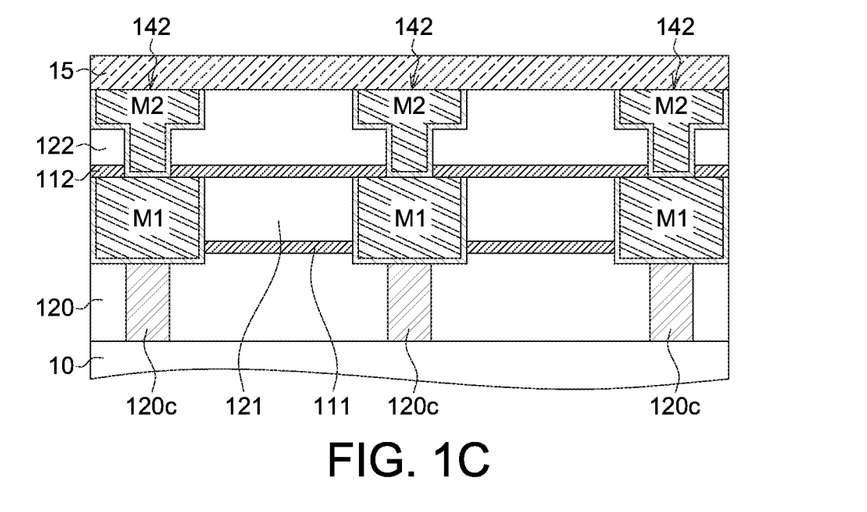
Figure 1D:
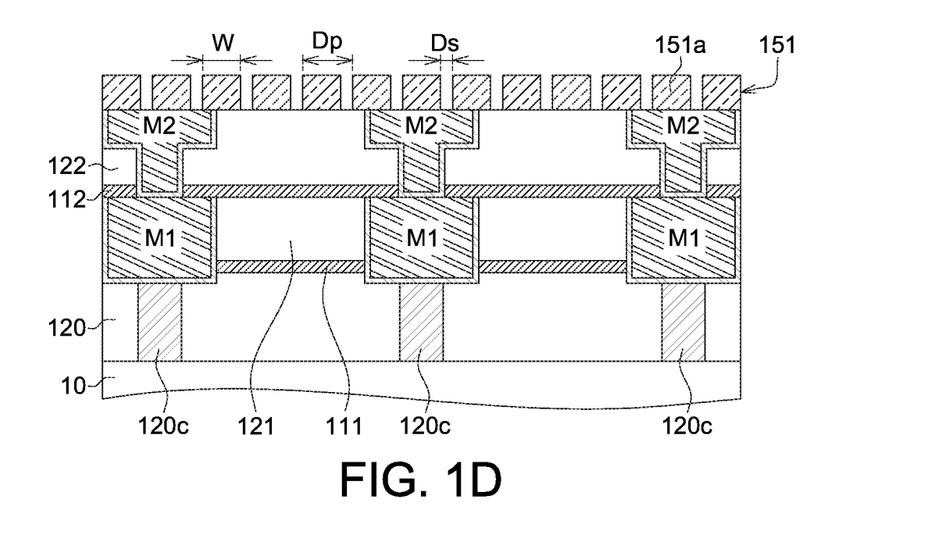
Figure 1E:
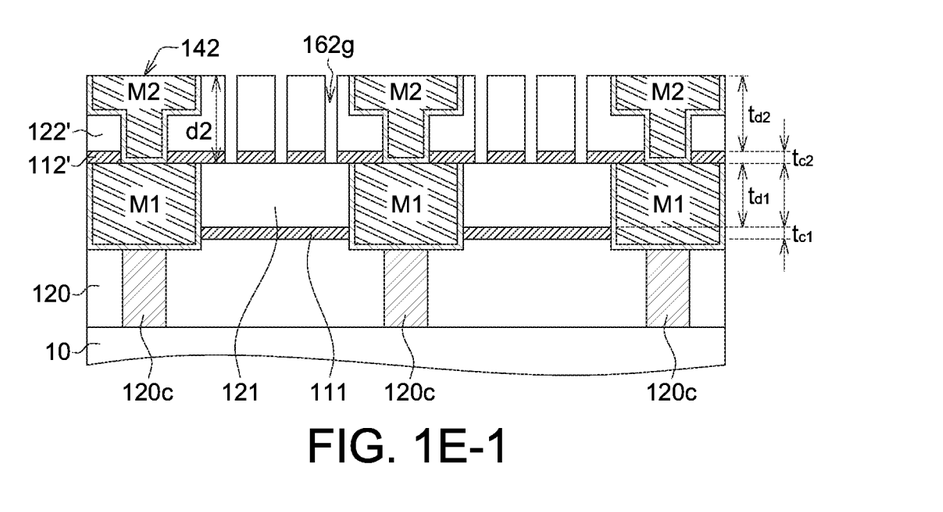
Figure 1E:
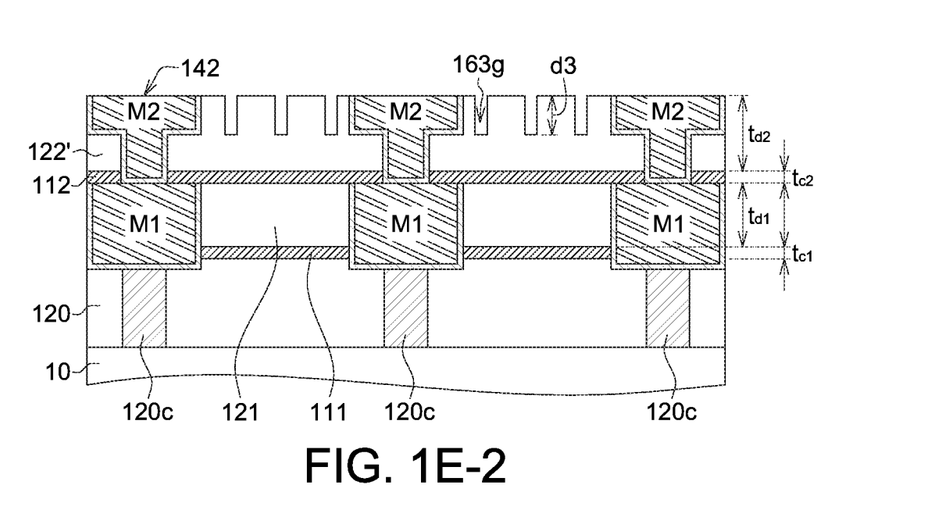
Figure 1E:
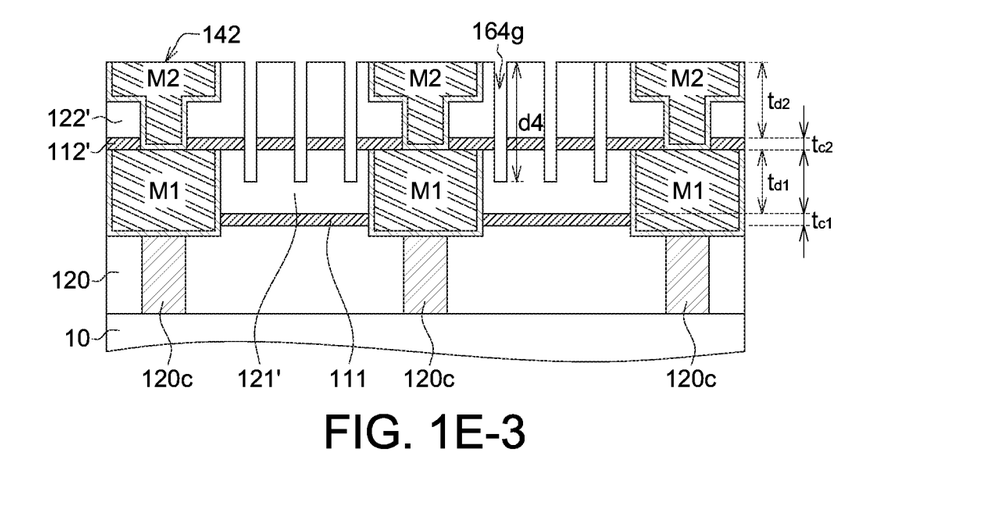
Figure 1E:
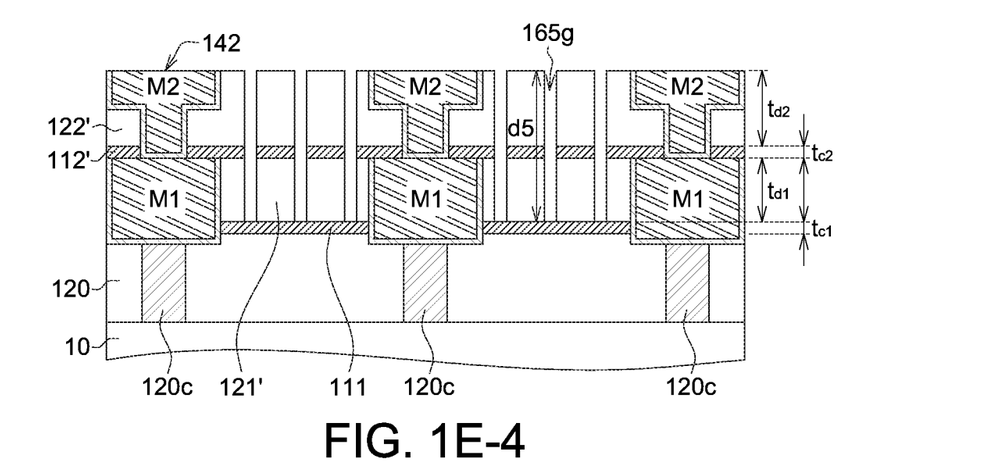

As shown in FIG. 1C, a DSA material 15 is entirely deposited on the second (low-k) dielectric layer 122 and on the conducting lines 142. As shown in FIG. 1D, the DSA material 15 is self separated by subjecting to a self separation treatment, such as an annealing/thermal treatment, to remove the domains of one element, thereby forming a nano-patterning layer 151. In other embodiment, a hardmask (HM) may be disposed between the conducting lines 142 and the DSA material 15, such as a bottom anti-reflective coating (BARC), for example, the silicon-rich anti-reflective hardmask (Si BARC) or other applicable materials.

In one embodiment, the DSA material 15 may comprise a copolymer of elements A and B which has self assembly characteristic. After self separation of the DSA material 15, the domains consisting of element A or B can be removed. The nano-patterning layer 151 possesses a particular pattern functions as etch mask, and one or both of the dielectric layers are subsequently patterned according to this etch mask. In one embodiment, nano-patterning layer 151 could comprise a plurality of nano-components 151a, as shown in FIG. 1D. The shapes of the nano-components 151a are determined based on the shapes of the to-be-created nano-gaps, and can be varied according to actual needs of the practical applications.

Afterwards, a pattern transfer from the nano-patterning layer 151 into the dielectrics for forming the nano-gaps formed between the adjacent conducting lines 142 is performed. In the first embodiment, one or both of the dielectric layers can be etched by using the nano-patterning layer 151 as a etch mask. For example, etching occurs in the regions of the second dielectric layer 122 where the nano-patterning layer 151 is uncovered. According to the embodiments, the nano-gaps can be formed in the second dielectric layer 122 or in the second capping layer 112, or can be formed by extending to the first capping layer 111. Four of applicable configurations of the nano-gaps 162g, 163g, 164g and 165g with different depths are illustrated in FIG. 1E-1, FIG. 1E-2, FIG. 1E-3 and FIG. 1E-4, respectively. Noted that the disclosure is not limited to those non-gaps as illustrated in the figures.

After forming the nano-gaps (162g, 163g, 164g or 165g), the conducting lines 142, the patterned second (low-k) dielectric layer 122' and the nano-gaps (162g, 163g, 164g or 165g) are capped with a third capping layer 17, as shown in FIG. 1F-1, FIG. 1F-2, FIG. 1F-3 or FIG. 1F-4, respectively. According to the first embodiment, the third capping layer 17 directly contacts the patterned second dielectric layer 122' and the conducting lines 142, and the nano-gaps (162g, 163g, 164g or 165g) extend downwardly from the third capping layer 17 into the layers underneath.

Please refer to FIG. 1F-1, the nano-gaps 162g extend downwardly from a surface (ex: bottom surface) of the third capping layer 17 and open the first dielectric layer 121 by removing the second capping layer 112, thereby forming the patterned second dielectric layer 122' and the patterned second capping layer 112'. The nano-gaps 162g expose the top surface of the first dielectric layer 121. The bottom surfaces of the nano-gaps 162g are lower than the bottom surface of the patterned second capping layer 112'. Also, a depth d2 of the nano-gaps 162g is larger than the thickness td2 of the second dielectric layer 122.

Please refer to FIG. 1F-2, the nano-gaps 163g extend downwardly from a surface (ex: bottom surface) of the third capping layer 17 to the second dielectric layer 122, thereby forming the patterned second dielectric layer 122'. The nano-gaps 163g partially open the second dielectric layer 122 by removing only a portion of the second dielectric layer 122. A depth d3 of the nano-gaps 163g is smaller than the thickness td2 of the second dielectric layer 122.

Please refer to FIG. 1F-3, the nano-gaps 164g extend downwardly from a surface (ex: bottom surface) of the third capping layer 17 to the first dielectric layer 121 by penetrating the second dielectric layer 122 and the second capping layer 112 and partially removing the first dielectric layer 121, thereby forming the patterned second dielectric layer 122', the patterned second capping layer 112' and the patterned first dielectric layer 121'. The nano-gaps 164g expose the first dielectric layer 121. The bottom surfaces of the nano-gaps 164g are lower than a bottom surface of the patterned second capping layer 112'. Also, a depth d4 of the nano-gaps 164g is larger than a sum of the thickness td2 of the second dielectric layer 122 and the thickness tc2 of the second capping layer 112, but smaller than a sum of the thickness td2 of the second dielectric layer 122, the thickness tc2 of the second capping layer 112 and the thickness td1 of the first dielectric layer 121.

Please refer to FIG. 1F-4, the nano-gaps 165g extend downwardly from a surface (ex: bottom surface) of the third capping layer 17 and expose the first capping layer 111 (ex: a top surface of the first capping layer 111) by penetrating the second dielectric layer 122, the second capping layer 112 and the first dielectric layer 121, thereby forming the patterned second dielectric layer 122', the patterned second capping layer 112' and the patterned first dielectric layer 121'. The bottom surfaces of the nano-gaps 165g are lower than the bottom surface of the second capping layer 112. Also, a depth d5 of the nano-gaps 165g is substantially equal to a sum of the thickness td2 of the second dielectric layer 122, the thickness tc2 of the second capping layer 112 and the thickness td1 of the first dielectric layer 121.

According to the embodiments, the semiconductor device with the nano-gaps 162g, 163g, 164g or 165g functioning as the air-gap insulators has great electrical properties, such as higher speed of operation and lower power consumption. Also, the manufacturing method provided in the embodiment facilitates the process for forming the desire pattern with nano-gaps (ex: 162g, 163g, 164g or 165g) having different depths in the practical application. Furthermore, by forming the DSA material and performing the DSA self separation (as shown in FIG. 1O and FIG. 1D), the pitch (Dp) and/or the width (W) of the nano-components 151a and/or the space (Ds) therebetween of the nano-patterning layer 151 of one embodiment could be decreased to less than 10 nm, such as about 9 nm. Accordingly, the embodiment is suitable for being applied to the manufacturing method of the very small scale electronic devices.

Second Embodiment

Figure 2A:
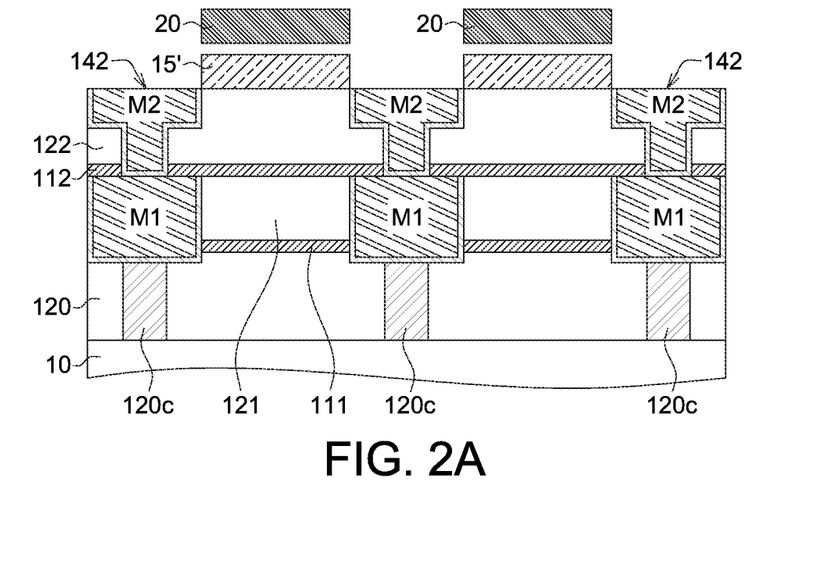
FIG. 2A depicts a patterned DSA material deposited in some regions on the second dielectric layer according to the second embodiment.
Figure 2B:
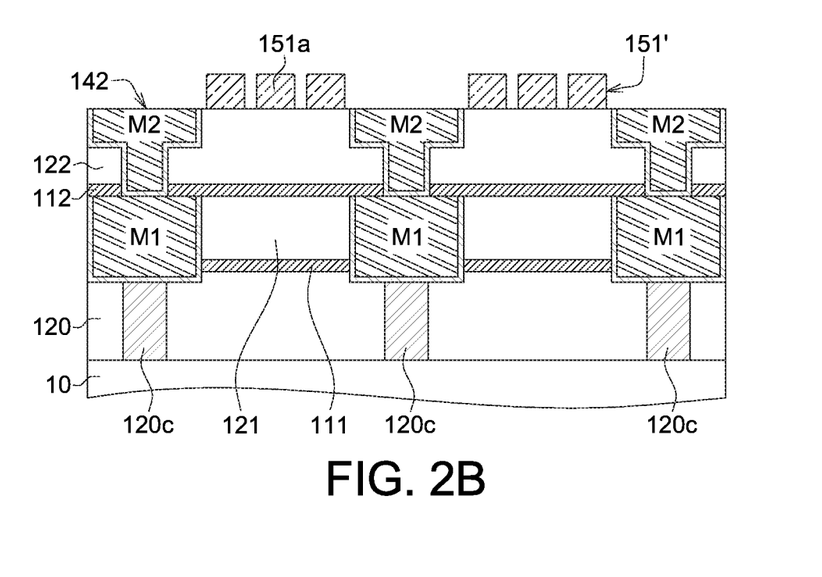
FIG. 2B depicts an etch mask formed after self separation of the patterned DSA material according to the second embodiment.

A method for manufacturing a semiconductor device of a second embodiment of the present disclosure is similar to that of the first embodiment, except for a configuration of an etch mask for patterning one or both of the dielectric layers. FIG. 2A depicts a patterned DSA material deposited in some regions on the second dielectric layer according to the second embodiment. FIG. 2B depicts an etch mask formed after self separation of the patterned DSA material according to the second embodiment. Please also refer to FIG. 1A-FIG. 1F and related descriptions of the first embodiment, and the similar contents are not redundantly repeated here.

In the first embodiment, a DSA material is entirely deposited on the low-k dielectric layer and on the metal layer (M1)(without using a mask), as shown in FIG. 1O. In the second embodiment, an extra mask 20 is optionally provided during patterning procedure of the DSA material. As shown in FIG. 2A, a patterned DSA material 15' is formed by a mask 20 (i.e. no DSA formed on the conductive lines 142). After self separation of the patterned DSA material 15', the nano-patterning layer 151' with a particular pattern as shown in FIG. 2B functions as an etch mask, and one or both of the dielectric layers are subsequently patterned according to the nano-patterning layer 151' (ex: comprising a plurality of nano-components 151a).

Figure 2C:
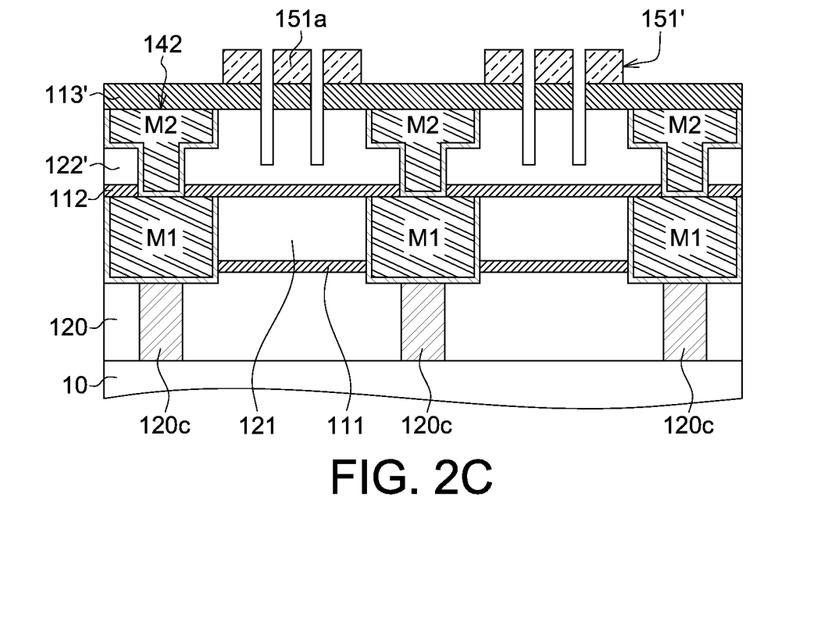
FIG. 2C depicts a patterned DSA material deposited on a third capping layer followed by performing the etching procedure according to the second embodiment.

Alternatively, a third capping layer can be further formed on the conductive lines 142, followed by forming the patterned DSA material 15' as depicted in FIG. 2A and FIG. 2B on the third capping layer. FIG. 2C depicts a patterned DSA material deposited on a third capping layer followed by performing the etching procedure according to the second embodiment. The patterned DSA material 15' formed on a third capping layer functions as an etch mask, and the third capping layer and one or both of the dielectric layers are subsequently patterned according to the nano-patterning layer 151' (ex: comprising a plurality of nano-components 151a) so as to form a patterned third capping layer 113' on the patterned second dielectric layer 122', as shown in FIG. 2C.

Third Embodiment

FIG. 3A-FIG. 3E illustrate a method for manufacturing a semiconductor device according to a third embodiment of the present disclosure. The method for manufacturing a semiconductor device of the third embodiment is similar to that of the first embodiment, except for the step of forming a third capping layer. In the first embodiment, the third capping layer 17 is formed after dielectric patterning, such as after formation and self separation of the DSA material and pattern transfer to the dielectrics. In the third embodiment, a third capping layer 113 is formed before dielectric patterning, such as before formation and self separation of the DSA material.

Figure 3A:
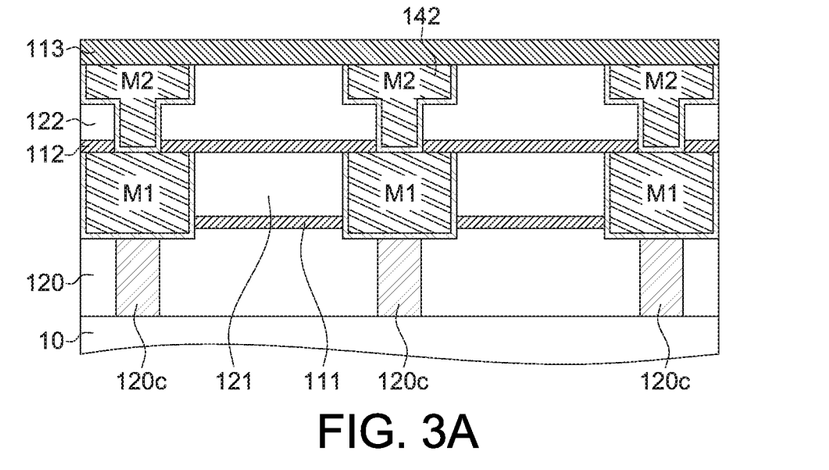
FIG. 3A-FIG. 3E illustrate a method for manufacturing a semiconductor device according to the third embodiment of the present disclosure.

First, a laminated structure as shown in FIG. 1B is provided, followed by forming a third capping layer 113 on the laminated structure. As shown in FIG. 3A, the laminated structure comprises a substrate 10, an ILD layer 120 formed on the substrate 10, several conductive contacts 120c formed in the ILD layer 120, a first capping layer 111 formed above the ILD layer 120, a first dielectric layer 121 (ex: low-k dielectric layer) formed on the first capping layer 111, a second capping layer 112 formed on the first dielectric layer 121, a second dielectric layer 122 (ex: ULK dielectric layer) formed on the second capping layer 112, and several conducting lines 142 (ex: depositing a metallic material 14 followed by planarization using CMP) separately formed above the substrate 10 and respectively connected to the conductive contacts 120c. Then, a third capping layer 113 is formed on the second dielectric layer 122 and the conducting lines 142.

Figure 3B:
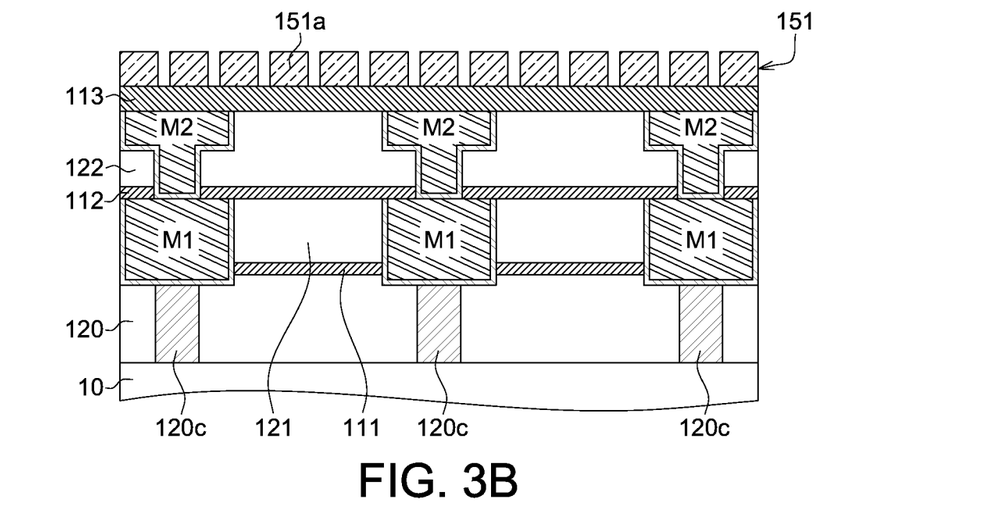

Afterward, a DSA material is deposited (entirely or partially using a mask) on the third capping layer 113, followed by self separation of the DSA material. After self separation of the DSA material (i.e. removing A or B of the copolymer of the DSA material) by annealing/thermal treatment, a nano-patterning layer 151 comprising the nano-components 151a is formed on the third capping layer 113, as shown in FIG. 3B. The details of the related components have been described in the first embodiment, and are not redundantly repeated herein.

Figure 3C:
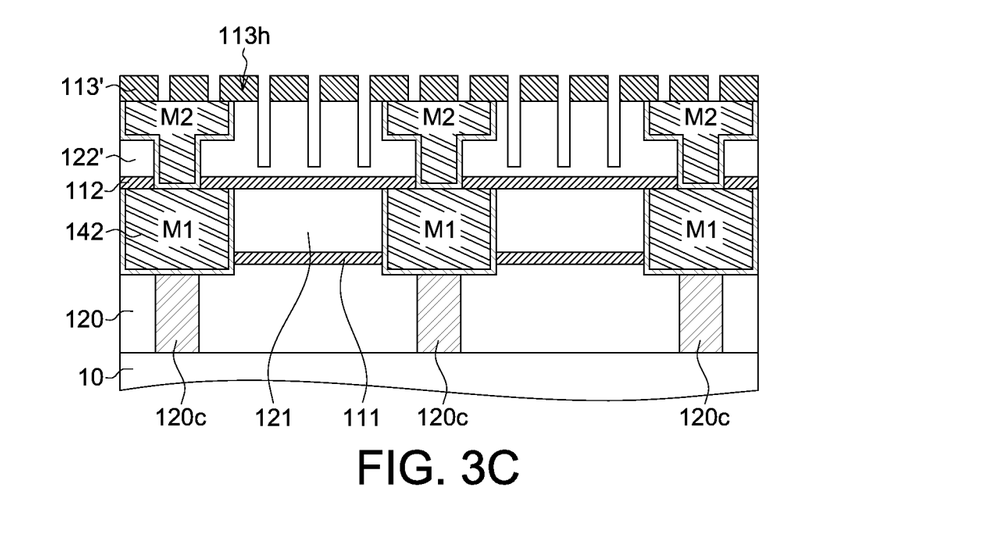
Figure 3D:
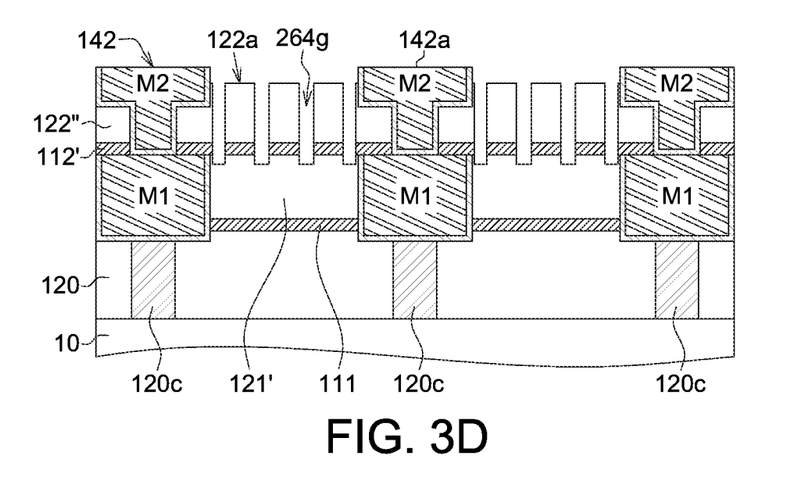

Afterwards, the procedures for patterning at least one of the dielectric layers are conducted to form a plurality of nano-gaps between the adjacent conducting lines 142. As shown in FIG. 3C, the third capping layer 113 and the second dielectric layer 122 are etched according to the nano-patterning layer 151, so as to form a patterned second dielectric layer 122' and a patterned third capping layer 113' stacked on the patterned second dielectric layer 122'. Next, the patterned second dielectric layer 122', the second capping layer 112 and the first dielectric layer 121 are further etched, so as to form a re-patterned second dielectric layer 122", a patterned second capping layer 112' and a patterned dielectric layer 121', as shown in FIG. 3D. The patterned third capping layer 113' would be consumed during the etch procedure.

In FIG. 3D, the top surface 122a of the re-patterned second dielectric layer 122" and the openings of the nano-gaps 264g are lower than the top surfaces 142a of the conducting lines 142. Also, the patterned third capping layer 113' of FIG. 3C comprises a pattern of holes 113h (ex: through holes penetrating the third capping layer 113), and the holes 113h are corresponding to the positions of the nano-gaps 264g (FIG. 3D) formed in the subsequent procedure.

It is noted that the present disclosure is not limited to the dielectric configuration as shown in the structure of FIG. 3D, the nano-gaps with desired depths (ex: depths d2-d5 in FIG. 1E-1-FIG. 1E-4) can be achieved by adjusting the procedures during pattern transfer by the nano-patterning layer 151, such as the thickness of the DSA material, the etch conditions (ex: etch rate, materials of the to-be-etched dielectric layers), etc.

Figure 3E:
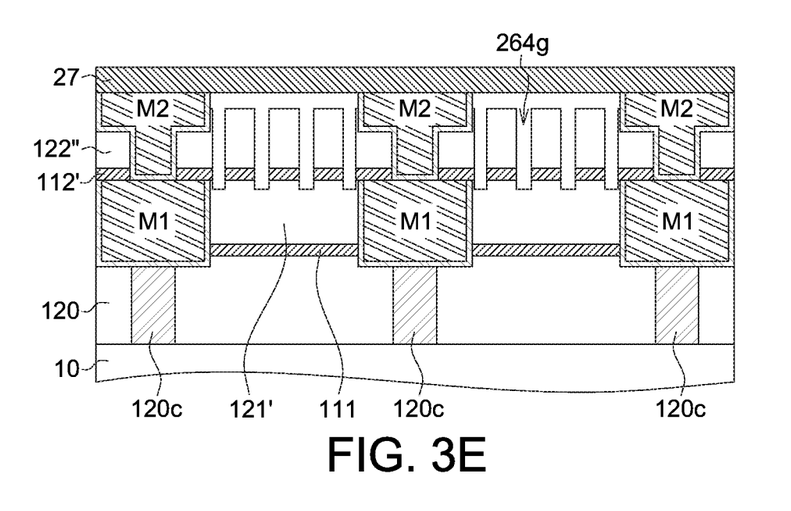

Next, the structure with plural nano-gaps 264g as shown in FIG. 3D is capped with a re-capping layer 27, so as to create air-gaps that insulate the conductive lines 142 (ex: Cu wires). As shown in FIG. 3E, the re-capping layer 27 is formed on the re-patterned second dielectric layer 122" and the conducting lines 142. According to the third embodiment, the re-capping layer 27 directly contacts the top surfaces of the conducting lines 142, and the top surfaces of the re-patterned second dielectric layer 122' and the nano-gaps are spaced apart from a bottom surface of the re-capping layer 27. It is noted that the third capping layer 113 (the patterned third capping layer 113') doesn't exist in the structure of FIG. 3D, and the structure of FIG. 3E comprises the first capping layer 111, the patterned capping layer 112' and the re-capping layer 27, so that the re-capping layer 27 can be numerically denoted as a "third" capping layer in the completed structure of FIG. 3E (or in a final structure of semiconductor device).

Figure 1F:
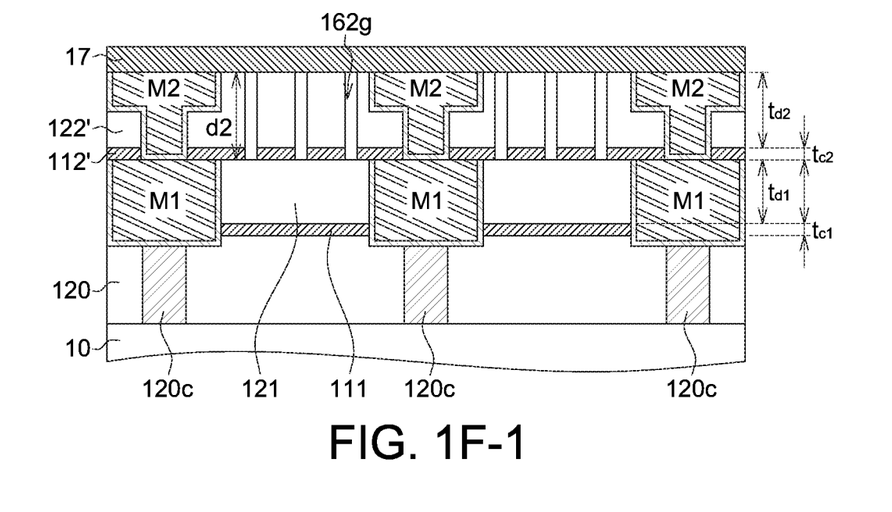
Figure 1F:
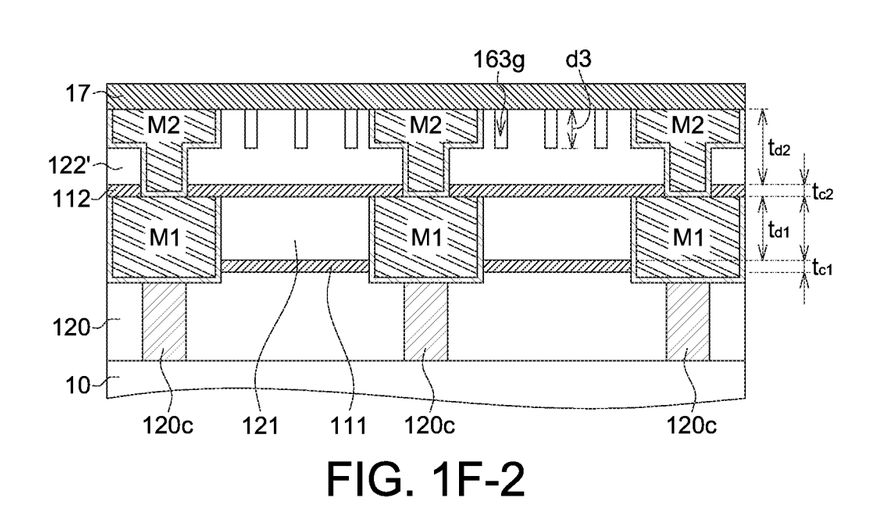
Figure 1F:
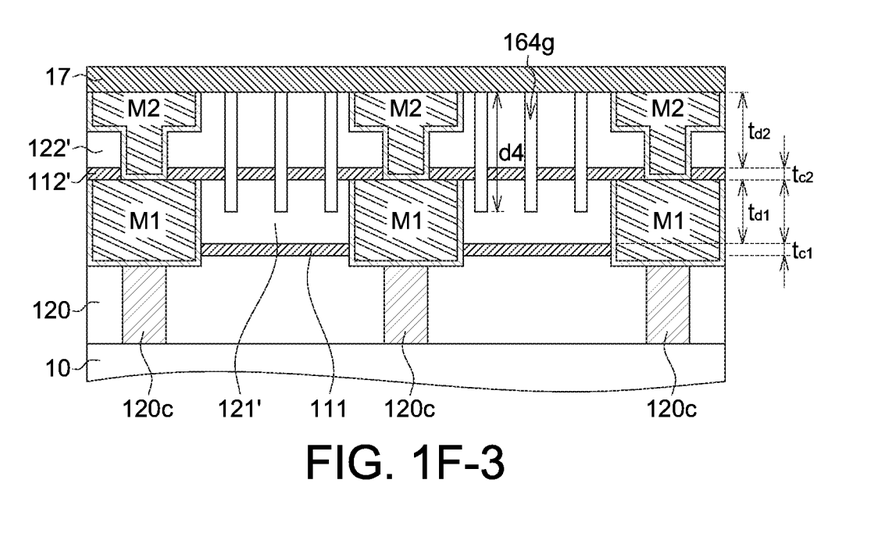
Figure 1F:
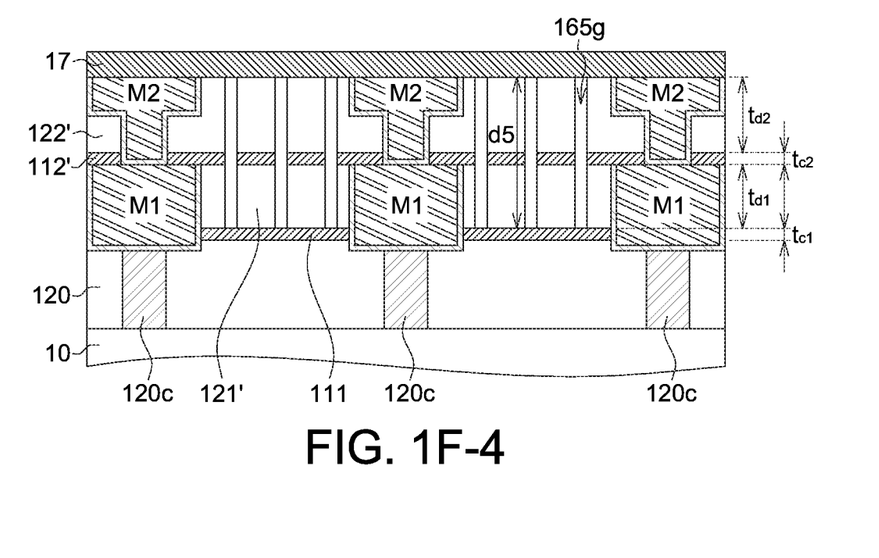

The structure manufactured by the third embodiment is different from the structures manufactured by the first and second embodiments. Please refer to FIG. 1F-1 and FIG. 3E. In the first and second embodiments, the top surfaces of the patterned second dielectric layer 122' and the top surfaces of the conductive lines 142 are typically at the same horizontal level, as shown in FIG. 1F-1. In the third embodiment, the top surface of the re-patterned second dielectric layer 122' is lower than the top surfaces 142a of the conductive lines 142, and the re-capping layer 27 spans the nano-gaps 264g and the re-patterned second dielectric layer 122" by setting at the conductive lines 142.

<Possible Patterns of the Nano-Patterning Layer After Phase Separation>

After DSA (directed self assembly) self separation (ex: by annealing/thermal treatment to cause phase separation of different polymers A and B, followed by removing polymer A or polymer B), several possible patterns of the nano-components of the nano-patterning layer (from the top view of the device) as an etch mask for the dielectric patterning could be created in the embodiments, such as Example 1 to Example 5 as described below.

FIG. 4, FIG. 5, FIG. 6, FIG. 7 and FIG. 8 schematically illustrate the top views of the nano-patterning layers according to Examples 1-5, respectively. According to the embodiments, the nano-gaps (ex: 341g, 342g, 343g, 344g and 345g) correspondingly adjacent to the nano-components (ex: 351a, 352a, 353a, 354a or 355a) of the nano-patterning layer (ex: 351, 352, 353, 354 or 355) are spaced apart from each other, and the nano-gaps (or the nano-components) can be regularly or irregularly extended in the spaces between the adjacent conducting lines 342.

Figure 4:
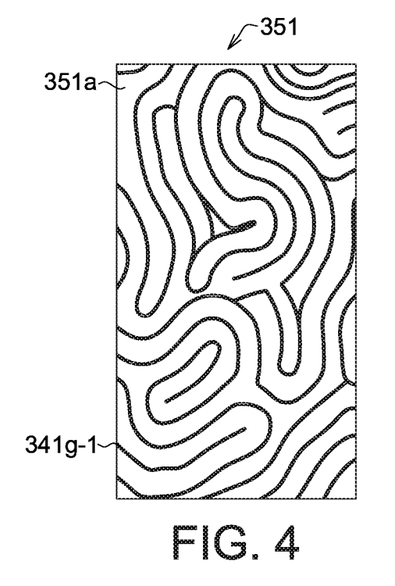
FIG. 4, FIG. 5, FIG. 6, FIG. 7 and FIG. 8 schematically illustrate the top views of the nano-patterning layers according to Examples 1-5, respectively.
Figure 5:
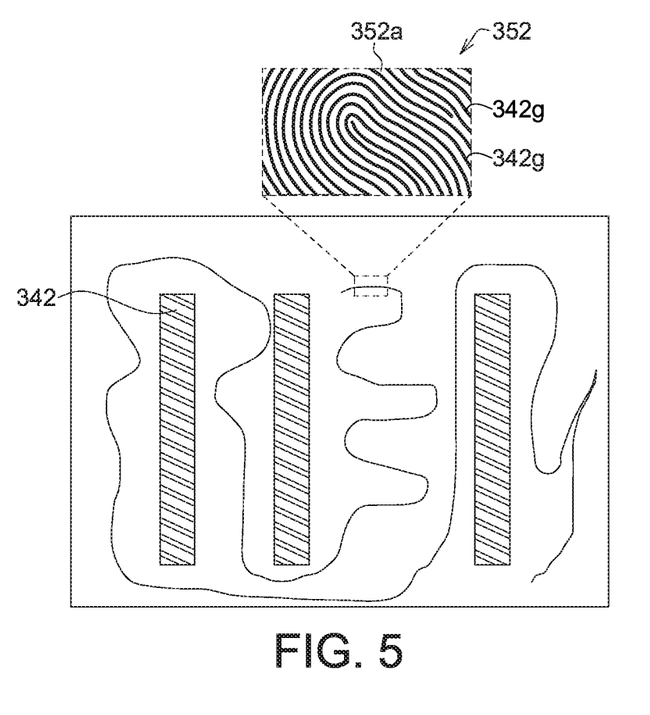

In Examples 1 and 2, the irregular lines (i.e. top views of the nano-components 351a and 352a) of the nano-patterning layers 351 and 352 could be formed after DSA self separation. The nano-gaps 341g, 342g, as well as the nano-components 351a, 352a, are irregularly extended in the spaces between the adjacent conducting lines 342, as shown in FIG. 4 and FIG. 5. Also, in Example 2 (FIG. 5), the lines formed by the nano-components 352a of the nano-patterning layer 352 irregularly run through the spaces between the conductive (ex: Cu) lines 342.

Figure 6:
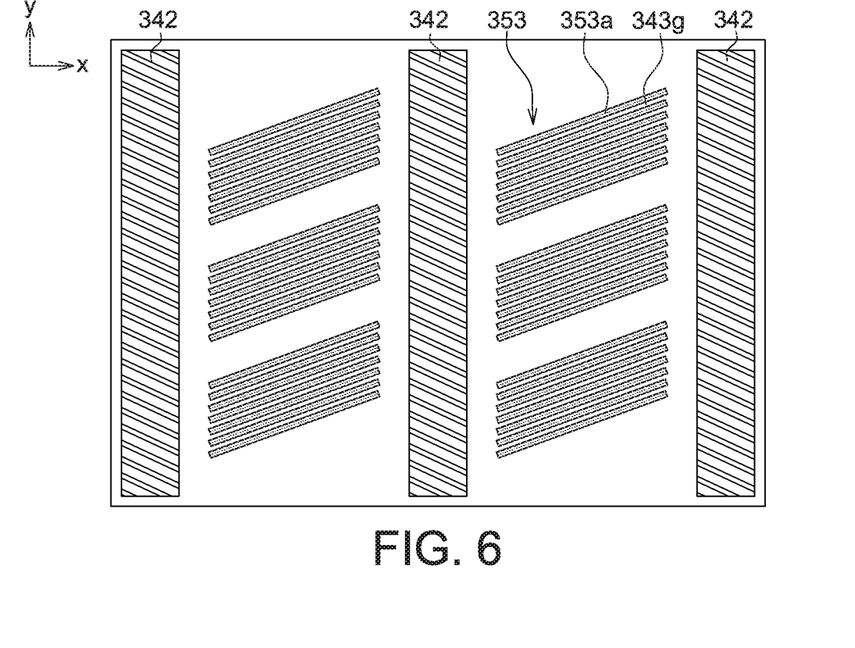
Figure 7:
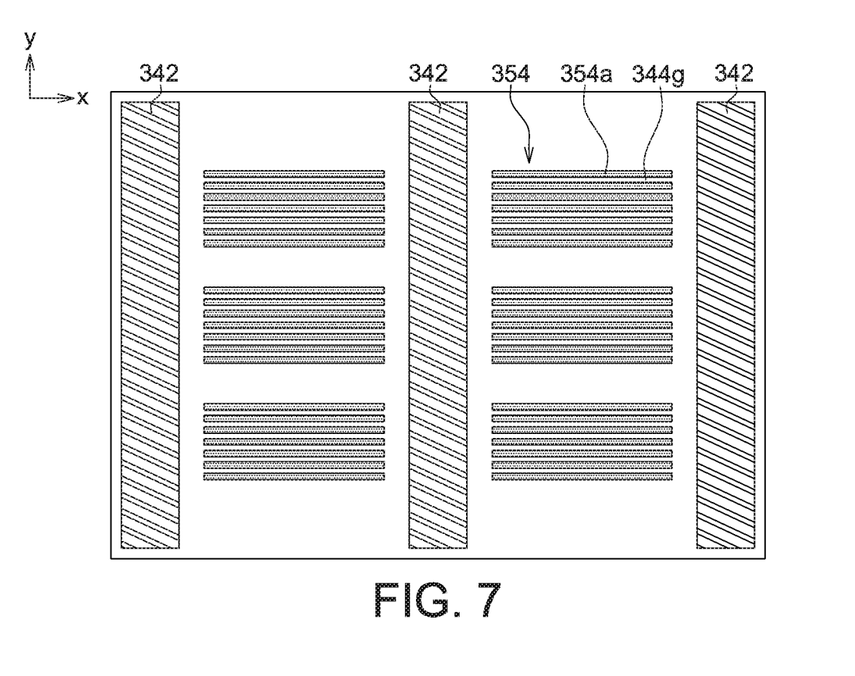

In Examples 3 and 4, the irregular lines (i.e. top views of the nano-components 353a and 354a) of the nano-patterning layers 353 and 354 are formed after DSA self separation. As shown in FIG. 6, the nano-gaps 343g, as well as the nano-components 353a of the nano-patterning layer 353, are regularly extended in spaces between the conducting lines 342, wherein an extending direction of the nano-gaps 343g is nonparallel to an extending direction (ex: y-direction) of the conducting lines 342. As shown in FIG. 7, an extending direction of the nano-gaps 344g is perpendicular to the extending direction (ex: y-direction) of the conducting lines 342.

Figure 8:
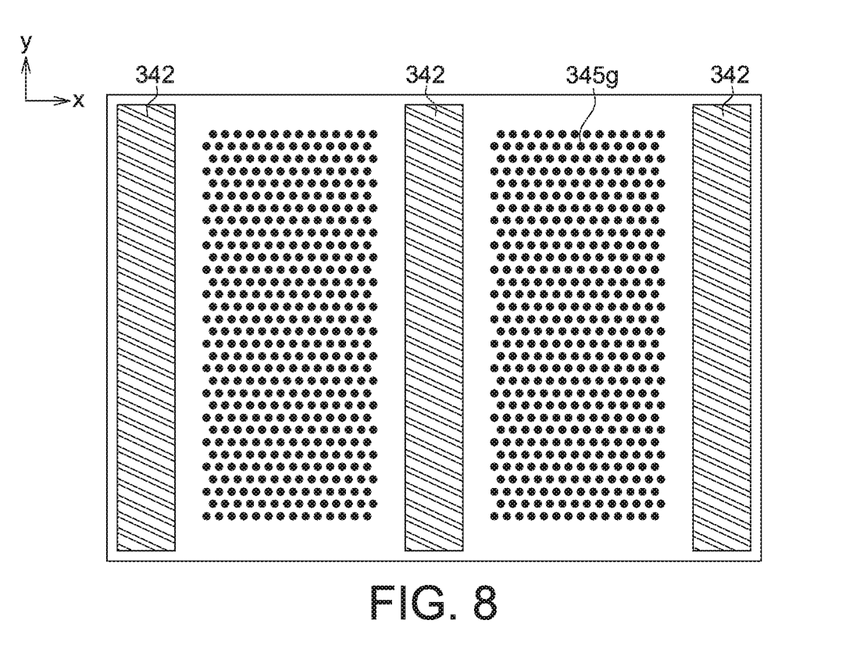

Although Examples 1-4 depict the line-shaped nano-gaps, the present disclosure is not limited thereto. In other applicable embodiments, the nano-gaps may have cross-sectional areas with a round shape, a rectangular shape, a square shape, an oval shape or other shapes, depending on the manufacturing conditions or the actual needs of practical applications. As shown in FIG. 8, the nano-gaps 345g of Example 5 are dispersed (randomly or orderly) between the conducting lines 342, and the nano-gaps 345g have the round shaped cross-sectional areas.

According to the embodiments, the electrical properties of the electronic apparatus with the semiconductor device having the nano-gaps of the embodiments can be greatly improved, thereby achieving the higher speed of operation and lower power consumption. Also, the manufacturing method of the embodiment provides the simple process for forming the nano-gaps with desired depths for satisfying the requirements of the practical applications. Furthermore, the size and the pitch of the nano-gaps are determined by the size and the pitch of the nano-components of the nano-patterning layer. According to the manufacturing method of the embodiment, a width or a pitch of the nano-components of the nano-patterning layer, or a space between the adjacent nano-components can be decreased to no more than 10 nm (such as about 9 nm). Thus, the embodiment is suitable for being applied to the manufacturing method of the very small scale electronic devices.

Other embodiments with different configurations such as patterns of the nano-gaps, the nano-components of the nano-patterning layer and the conductive lines can be applicable, and the variations depend on the actual needs of the practical applications. It is, of course, noted that the configurations of FIG. 1F-1, FIG. 1F-2, FIG. 1F-3, FIG. 1F-4, FIG. 3E, FIG. 4-FIG. 7 are depicted only for demonstration, not for limitation. It is known by people skilled in the art that the shapes or positional relationship of the constituting elements could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
   providing a substrate;
   forming a first capping layer above the substrate;
   forming a first dielectric layer on the first capping layer;
   forming a second capping layer on the first dielectric layer;
   forming a second dielectric layer on the second capping layer;
   forming a plurality of conducting lines on the substrate, wherein the plurality of conducting lines separate from each other and penetrate the second dielectric layer, the second capping layer, the first dielectric layer and the first capping layer;
   forming a plurality of nano-gaps between the plurality of conducting lines and being positioned in the second capping layer or extending to the first capping layer, wherein the plurality of nano-gaps partially open one of the second and first dielectric layers, or the plurality of nano-gaps expose the first capping layer; and
   forming a third capping layer on the plurality of conducting lines, the second dielectric layer and the plurality of nano-gaps,
   wherein the plurality of nano-gaps are formed using a nano-patterning layer as a mask for performing an etch procedure, wherein formation of the nano-patterning layer comprises:
      forming a directed self assembly (DSA) material allowing phase separation after annealing of the DSA material, so as to form first sections and second sections as two individual domains;
      removing the individual domains of the first sections or the second sections, wherein the remained individual domains of the second sections or the first sections form the nano-patterning layer.

2. The method according to claim 1, wherein the DSA material is formed on the second dielectric layer.

3. The method according to claim 1, wherein the DSA material is formed on the third capping layer.

4. The method according to claim 1, wherein a depth of the plurality of nano-gaps is smaller than a thickness of the second dielectric layer.

5. The method according to claim 1, wherein a depth of the plurality of nano-gaps is larger than a thickness of the second dielectric layer.

6. The method according to claim 1, wherein a depth of the plurality of nano-gaps is equal to or larger than a sum of a thickness of the second dielectric layer and a thickness of the second capping layer.

7. The method according to claim 1, wherein the plurality of nano-gaps penetrate the second dielectric layer and the second capping layer, and partially open the first dielectric layer.

8. The method according to claim 1, wherein bottom surfaces of the plurality of nano-gaps are lower than a bottom surface of the second capping layer.

9. The method according to claim 1, wherein the plurality of nano-gaps expose a top surface of the first capping layer.

10. The method according to claim 1, wherein the third capping layer directly contacts the second dielectric layer and the plurality of conducting lines, and the plurality of nano-gaps extend continuously and downwardly from the bottom surface of the third capping layer.

11. The method according to claim 1, wherein the third capping layer comprises a pattern of holes, and the holes are positioned correspondingly to the plurality of nano-gaps.

12. The method according to claim 1, wherein the plurality of nano-gaps partially open one of the second and first dielectric layers, or the plurality of nano-gaps expose the first capping layer, and a top surface of the second dielectric layer is spaced apart from a bottom surface of the third capping layer to form a cavity between the bottom surface of the third capping layer and the top surface of the second dielectric layer, and the cavity horizontally extended between adjacent conducting lines and positioned above the plurality of nano-gaps, wherein the cavity communicates with the plurality of nano-gaps between the adjacent conducting lines.

13. The method according to claim 1, wherein a top surface of the second dielectric layer and uppermost openings of the plurality of nano-gaps are spaced apart from a bottom surface of the third capping layer to form a cavity between the bottom surface of the third capping layer and the top surface of the second dielectric layer, and the cavity horizontally extended between adjacent conducting lines and positioned above the plurality of nano-gaps, wherein the cavity communicates with the plurality of nano-gaps between the adjacent conducting lines.

14. The method according to claim 13, wherein the cavity and the plurality of nano-gaps form a combination of air-gaps formed under the third capping layer, and the plurality of nano-gaps are positioned under the cavity and extended vertically, and two or more of the plurality of nano-gaps are separated from each other at least by the second dielectric layer.

15. The method according to claim 13, wherein the cavity extended horizontally has two opposite ends in direct contact with the adjacent conducting lines.

16. The method according to claim 13, wherein the cavity is extended in parallel to the substrate and formed between the third capping layer and the plurality of nano-gaps.

17. The method according to claim 1, wherein a top view of the plurality of nano-gaps presents a pattern of nano-stripes extending in spaces between the plurality of conducting lines, and said nano-stripes irregularly extend between adjacent conducting lines.

18. The method according to claim 1, wherein a top view of the plurality of nano-gaps presents a pattern of nano-stripes extending in spaces between the plurality of conducting lines, and said nano-stripes extending between adjacent conducting lines are parallel to each other.

19. The method according to claim 18, wherein an extending direction of said nano-stripes is nonparallel to an extending direction of the plurality of conducting lines from the top view.

* * * * *